(12) United States Patent
Seet et al.

(10) Patent No.: US 6,403,478 B1
(45) Date of Patent: Jun. 11, 2002

(54) LOW PRE-HEAT PRESSURE CVD TIN PROCESS

(75) Inventors: Chim-Seng Seet; Chyi Shyuam Chern; Juan Boon Tan, all of Singapore (SG)

(73) Assignee: Chartered Semiconductor Manufacturing Company, Singapore (SG)

( * ) Notice: Subject to any disclaimer, the term of this patent is extended or adjusted under 35 U.S.C. 154(b) by 0 days.

(21) Appl. No.: 09/651,966

(22) Filed: Aug. 31, 2000

(51) Int. Cl.[7] ............................................. H01L 21/44
(52) U.S. Cl. ...................... 438/672; 438/675; 438/685; 438/627; 438/629; 438/637; 438/643; 438/648
(58) Field of Search ................................ 438/672, 675, 438/653, 627–629, 637–640, 648, 643–645, 685–688

(56) References Cited

U.S. PATENT DOCUMENTS

| | | | |
|---|---|---|---|
| 5,246,881 A | | 9/1993 | Sandhu et al. ............... 437/192 |
| 5,610,106 A | | 3/1997 | Foster et al. ................ 437/245 |
| 5,679,981 A | * | 10/1997 | Kuwajima ................... 257/752 |
| 5,789,321 A | | 8/1998 | Ohshita ....................... 438/680 |
| 5,840,628 A | | 11/1998 | Miyamoto ................... 438/680 |
| 5,861,675 A | * | 1/1999 | Sasaki et al. ................ 257/764 |
| 6,136,691 A | * | 10/2000 | Chen ........................... 438/627 |
| 6,159,853 A | * | 12/2000 | Iai ............................... 438/676 |
| 6,215,186 B1 | * | 4/2001 | Konecni et al. ............. 257/751 |

\* cited by examiner

*Primary Examiner*—Tuan H. Nguyen
*Assistant Examiner*—Thanh Nguyen
(74) *Attorney, Agent, or Firm*—George O. Saile; Rosemary L. S. Pike

(57) ABSTRACT

A new method for preventing intermittent high Kelvin via resistance is achieved. This is accomplished by lowering the chamber pressure during warm-up, which prevents the wafer temperature from rising above about 380° C. The present invention uses a pressure of between 2 and 3 Torr during warm-up of the wafer prior to barrier metal deposition rather than 5 Torr, which is conventionally used. Using the conventional pressure of 5 Torr the wafer temperature overshoots to about 395° C. before settling to about 380° C. By reducing the pressure to between 2 and 3 Torr, the thermal conductivity between the wafer heater and the wafer is reduced and the overshoot reduced or eliminated. The lower temperature reduces the deposition rate by approximately 10 angstroms over a 15 second deposition, but this is compensated for by an increase in deposition time. However, because the reaction is carried out in the reaction-limited regime, the step coverage will increase when wafer temperature is reduced. The deposition is followed by a $N_2/H_2$ plasma-annealing step.

20 Claims, 3 Drawing Sheets

LOW PRE-HEAT PRESSURE CVD TIN PROCESS

BACKGROUND OF THE INVENTION (1) Field of the Invention

The invention generally relates to the manufacturing of integrated circuits, and more particularly to a method of improving the reliability of titanium nitride (TiN) vias using chemical vapor deposition (CVD) in the integrated circuit manufacturing process.

(2) Description of Prior Art

The term via is used to describe interconnection between two metal interconnection layers in a semiconductor. In a typical application for an integrated circuit manufacturing process, a via opening is etched through a dielectric layer to an underlying conductor or conductive area to which an electrical contact is to be made. Titanium nitride (TiN) is typically used in CVD to line the walls of the via opening since it will not react with underlying doped silicon structures during subsequent high temperature processing. The via opening is subsequently filled with a metal such as Tungsten (W). A "Kelvin" via is a single, isolated via positioned over a large metal pad.

Refer now to FIG. 1 showing a typical mechanism for performing chemical vapor deposition (CVD). For the CVD TiN process, the wafer 100 is moved into the deposition chamber 102 and preheated to remove any thermal history. The wafer heater 104 is set to approximately 450° C., but the actual wafer 100 temperature only reaches about 380° C. To prevent any heat loss to the showerhead 106 during the heating stage, the wafer 100 and heater 104 are lowered away from the showerhead 106 using the positioning mechanism 114. Meanwhile, the chamber 102 is depressurized to 5 Torr using the pump 108 and pressure control valve 112 while the chamber 102 is purged with argon and nitrogen through the gas inlet 110. Gas flows are adjusted to optimize heat transfer and temperature uniformity of the wafer 100. Since the wafer 100 is only resting on the heater 104, the gas cushion between them is the mechanism for most of the thermal conduction. However, with the pressure set to 5 Torr, the wafer 100 temperature overshoots to a peak of 395° C. during this preheating step before settling at approximately 380° C. The deposition process is then completed as is typical in the art where the showerhead 106 is positioned, the gas flow and pressure are set, and the deposition is performed.

Referring now to FIG. 2 showing a via contact 214 and a completed Kelvin via 216. A substrate 200 is provided which may contain active semiconductor devices (not shown) such as transistors. Conducting metal lines 202 may be patterned on the substrate 200. A dielectric layer 204 such as $SiO_2$ is patterned over the metal lines 202 and substrate 200. Via openings 210 are the etched into the dielectric layer 204 exposing the semiconductor devices (not shown) and metal lines 202. Typically a glue layer of titanium (not shown) is patterned to line the via opening 210, followed by a barrier metal 206, typically titanium nitride (TiN). The via opening 210 is then filled with a conducting material 208 such as Tungsten (W).

Using this prior art recipe, Kelvin via resistances above 100 Ω/via are observed. Acceptable Kelvin vias have a resistance of typically less than 20 Ω/via. Using a scanning electron microscope (SEM), a cross section of the via shows that the underlying metal protrudes into the via opening on Kelvin vias with high resistance. This problem is illustrated in FIG. 3. A stress void 212 forms in the conducting metal line 202 and significantly reduces the via contact area. This results in higher resistance in the Kelvin via 216 and often intermittent circuit operation. It is believed that the overshoot in wafer temperature during the preheating process during TiN CVD is the cause of the stress voids 212, forcing the conducting metal line 202 to protrude into the via opening 210.

Other approaches attempt to address problems associated with forming contacts and vias. U.S. Pat. No. 5,789,321 to Ohshita teaches a method of CVD TiN using $TiCl_4$ and a nitrogen source where the silicon is heated to 500° C. and the chamber pressure is 0.15 Torr. U.S. Pat. No. 5,840,628 to Miyamoto teaches a method using a plasma enhanced CVD (PECVD) TiN two-step deposition. U.S. Pat. No. 5,246,881 to Sandhu et al teaches a via process where the substrate is heated to 200–600° C. (400° C. optimum) and the chamber pressure is reduced to 0.1 to 100 Torr (preferably 0.5 Torr). U.S. Pat. No. 5,561,106 to Foster et al teaches a method using ammonia in the TiN CVD process. Here, the substrate is heated to between about 400° C. to 500° C. and the chamber pressure is between 0.5 and 20 Torr.

SUMMARY OF THE INVENTION

A principal object of the present invention is to provide a method of fabricating a reliable contact in the manufacture of an integrated circuit device.

Another object of the present invention is to prevent the intermittent high Kelvin via resistance in a contact.

Another object of the present invention is the prevention of the wafer temperature overshoot during the CVD warm-up step.

Another object of the present invention is the prevention of intermittent high Kelvin vias by preventing the wafer temperature overshoot prior to barrier metal deposition.

Yet another object of the present invention is the prevention of intermittent high Kelvin vias by preventing the wafer temperature overshoot by lowering the chamber pressure during warm-up prior to barrier metal deposition.

Yet another object of the present invention is the prevention of intermittent high Kelvin vias by performing a plasma annealing step after deposition of the metal filling the via.

Accordingly, a new method for preventing intermittent high Kelvin vias by preventing the wafer temperature overshoot by lowering the chamber pressure during warm-up prior to barrier metal deposition is achieved. The present invention uses a chamber pressure of between 2 and 3 Torr during warm-up of the wafer prior to barrier metal deposition rather than 5 Torr, which is conventionally used. By reducing the pressure, the thermal conductivity between the wafer heater and the wafer is reduced, and the overshoot in the wafer temperature is minimized. This reduces the deposition rate by approximately 10 angstroms over a 15 second deposition. This is compensated for by an increase in deposition time. However, because the reaction is carried out in the reaction-limited regime, the step coverage will increase as the wafer temperature is reduced. This is followed by an $N_2/H_2$ plasma annealing performed with a wafer temperature between about 350° C. and 420° C. The process is then completed by depositing and patterning the second metal layer.

BRIEF DESCRIPTION OF THE DRAWINGS

In the accompanying drawings forming a material part of this description, there is shown.

DESCRIPTION OF THE PREFERRED EMBODIMENT

Figure 1:
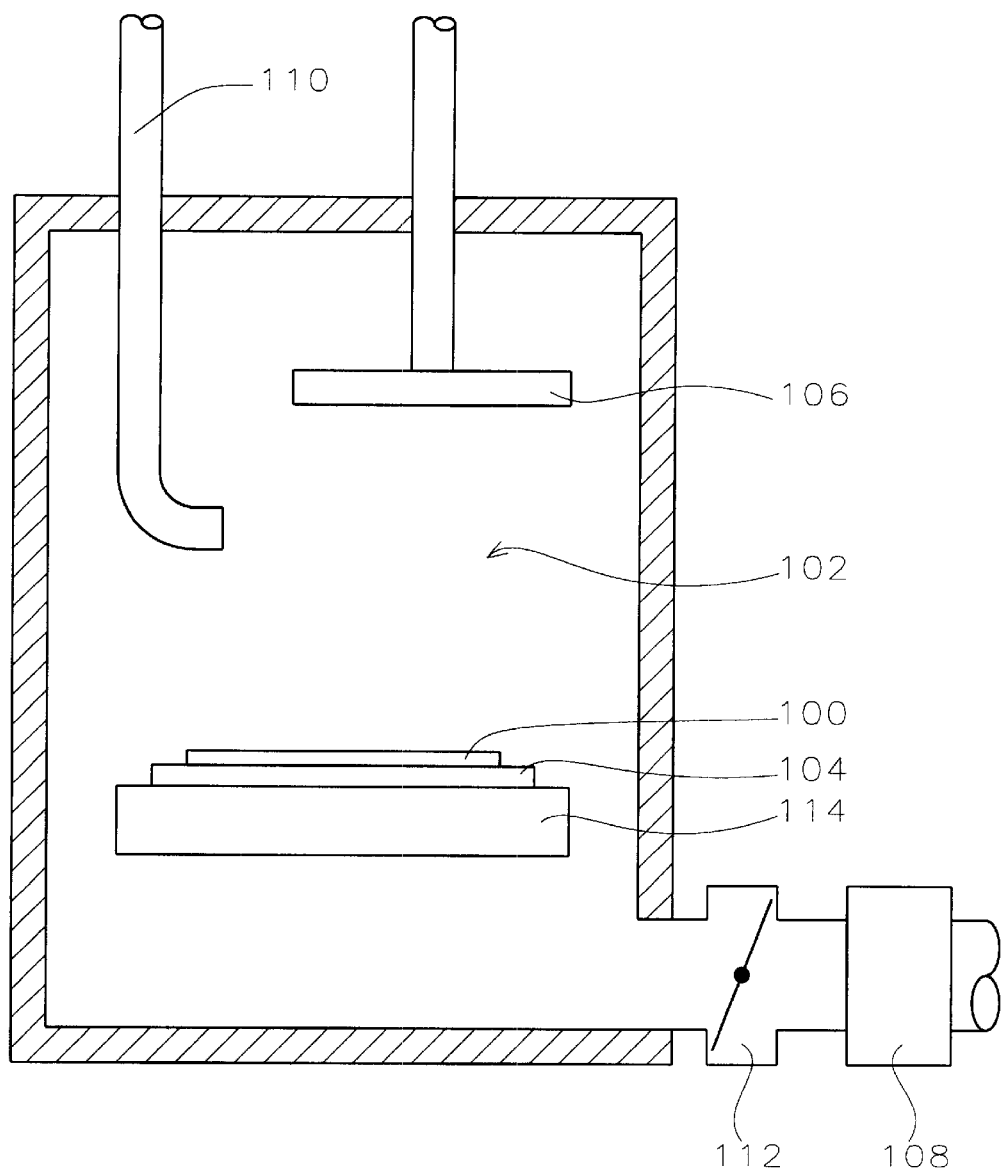
FIG. 1 illustrates in cross-section a schematic representation of the CVD apparatus.

Refer again to FIG. 1 showing a typical mechanism for performing chemical vapor deposition (CVD). For the CVD TiN process of the present invention, the wafer 100 is moved into the deposition chamber 102 and preheated to remove any thermal history as is conventional in the art. The wafer heater 104 is set to approximately 450° C. To prevent heat loss to the showerhead 106 during this step, the wafer 100 and heater 104 are lowered away from the showerhead 106 using the positioning mechanism 114. The difference between this invention and the current practice occurs in the chamber pressure during the heating step. In the present invention, the chamber 102 is depressurized to between about 2 and 3 Torr (vs. the conventional 5 Torr) using the pump 108 and pressure control valve 112, while the chamber 102 is purged with argon and nitrogen through the gas inlet 110. Gas flows are adjusted to optimize heat transfer and temperature uniformity of the wafer 100. The gas cushion between the wafer 100 and heater 104 is the mechanism for most of the thermal conduction. With the pressure set to between about 2 to 3 Torr, the wafer 100 temperature rises gradually to a settling temperature of approximately 370° C. to 380° C. without any overshoot in temperature. The lower warm-up temperature eliminates the temperature overshoot, preventing the formation of stress void in the underlying metal, and results in a more reliable via contact. A drop in deposition rate due to the lower temperature is compensated for by increasing the deposition time. An $N_2/H_2$ plasma annealing with the wafer temperature between about 350° C. to 420° C. follows. The remainder of the process is unchanged, and continues as is conventional in the art.

Figure 2:
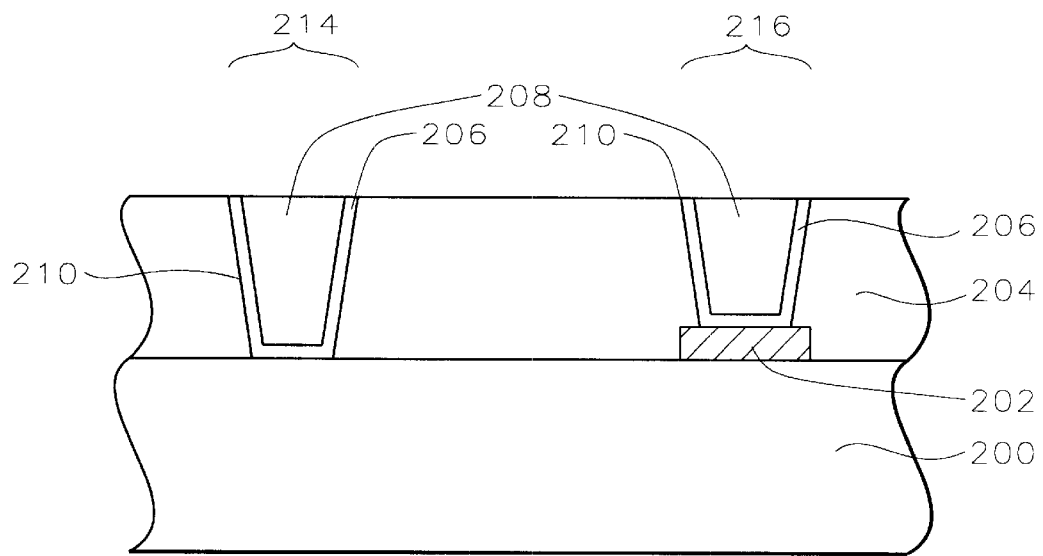
FIG. 2 shows in cross-section a completed via contact and Kelvin via structure where a good contact is made with the structure below.
Figure 3:
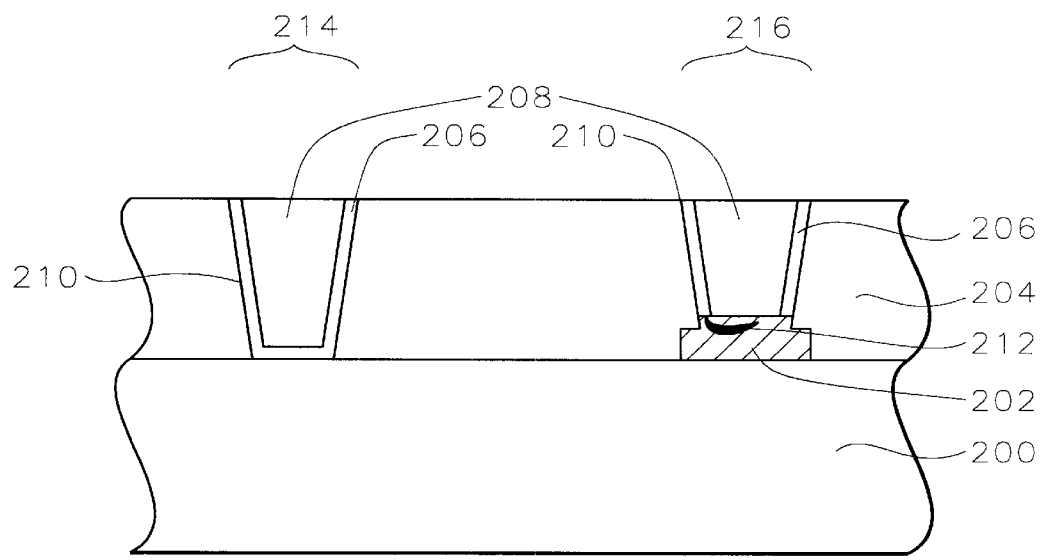
FIG. 3 shows in cross-section a completed via contact and a completed Kelvin via structure where the metal has been displaced from the lower point of contact, illustrating the problem that is being solved by the present invention.

Referring now again to FIG. 2, a cross section of a via contact 214 and a Kelvin via 216 are shown where the process successfully forms an electrical passageway from above the surface of the dielectric layer 204 to the substrate 200 and to an underlying metal line 202, respectively. To create this structure, a substrate 200 is provided. The substrate 200 may contain active semiconductor devices such as transistors (not shown). Metal lines 202 may be patterned over the substrate 200. A dielectric layer 204 is deposited overlying the substrate 200 and metal lines 202. Via openings 210 are etched into the dielectric layer 204 to reach the substrate 200 or the metal lines 202. A glue layer (not shown) such as titanium (Ti) is then deposited in the via opening 210. This is followed by a deposition of a barrier layer 206, such as titanium nitride (TiN) to a thickness of between about 25 and 200 angstroms. This is performed using the CVD process described in the previous paragraph with the preheating steps where the chamber pressure is between about 2 and 3 Torr, keeping the wafer temperature under about 380° C. The via opening 210 is then filled with a conducting metal 208 such as tungsten (W) using a two-step process. This two-step process is what differentiates the present invention from the prior art inventions of Sandhu et al. (U.S. Pat. No. 5,246,881) and Foster et al. (U.S. Pat. No. 5,610,106). The deposition is performed with the wafer temperature between about 300° C. to 390° C. (preferably between 365° C. and 380° C.). Heat conduction is the dominant mechanism for heat transfer to the substrate during this step. This is followed by an $N_2/H_2$ plasma annealing with the wafer temperature between about 350° C. to 420° C. Convection dominates the heat transfer to the substrate during the plasma annealing. Both wafer temperature and chamber pressure are tunable allowing enhancement of step coverage.

Figure 4:
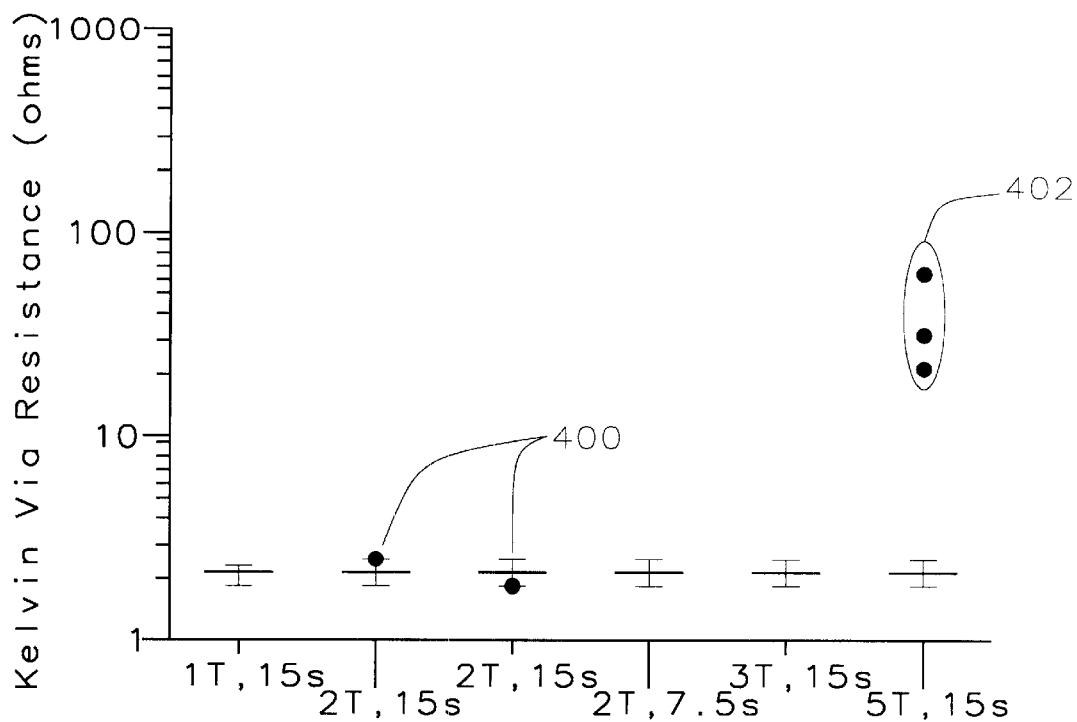
FIG. 4 shows a graphical comparison of sample data of via resistances where the pre-heat pressure is 2 Torr and 5 Torr.

FIG. 4 shows graphically data taken from a 0.25 micron test chip with a split lot illustrating the effect of pressure difference in via resistance. The data 400 using a pressure of 2 Torr and a 15 second warm-up had Kelvin via resistances of less than 3 ohms. The data 402 used the conventional warm-up pressure of 5 Torr and a 15 seconds warm up and exhibited Kelvin via resistance of greater than 20 ohms. This clearly demonstrates the importance of the present invention's use of lower warm-up pressure in manufacturing reliable low resistance vias.

Figure 5:
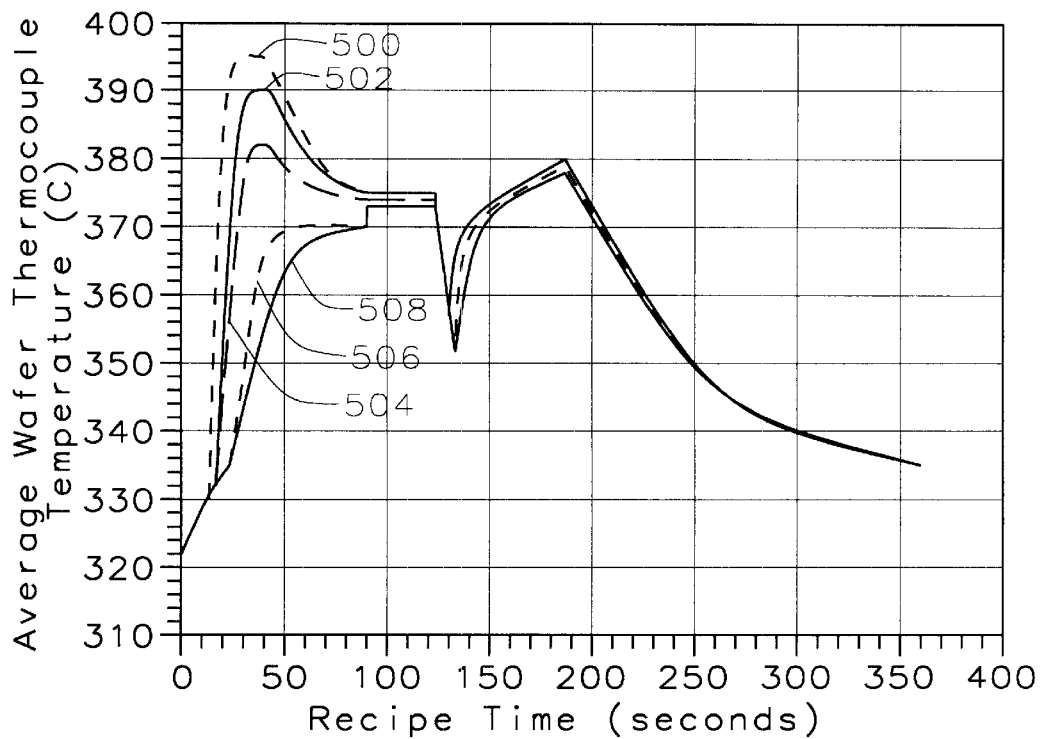
FIG. 5 shows the variation in wafer temperature over time at pressures from 1 to 5 Torr.

FIG. 5 shows the temperature vs. time response of the wafer at different pressures. It is important to note that wafer heater temperature is maintained at a constant 450° C. Looking particularly at the temperature data between 20 and 50 seconds, notice that at pressures of 4 Torr 502 and 5 Torr 500, the wafer temperature overshoots to approximately 390° C. and 395° C. respectively. At a pressure of 3 Torr 504, there is very little temperature overshoot with the wafer temperatures peaking at approximately 380° C. At a pressures of 2 Torr 506 and 1 Torr 508, there is no temperature overshoot and the wafer temperature eventually reaches approximately 370° C. Since this is the only change in the process, other than compensating for the reduction in deposition rate and the plasma annealing, it points to the temperature overshoot as the cause of the high Kelvin via resistance.

While the invention has been particularly shown and described with reference to the preferred embodiments thereof, it will be understood by those skilled in the art that various changes in form and details may be made without departing from the spirit and scope of the invention.

What is claimed is:

1. A method of via formation in the manufacturing of an integrated circuit device comprising:

providing semiconductor device structures in and on the substrate of a semiconductor wafer wherein said semiconductor device structures include gate electrodes, source and drain regions and metal interconnection lines;

depositing a dielectric layer overlying said semiconductor device structures;

etching a via opening through said dielectric layer to contact one of said metal interconnection lines;

loading said wafer into a deposition chamber and warming said wafer to a temperature of between 370° C. and 380° C. at a pressure between 2 and 3 Torr wherein said temperature not greater than 380° C. prevents protrusion of said metal interconnection line into said via opening;

thereafter conformally depositing a barrier layer within said via opening wherein the temperature of said wafer remains at or below 380° C. wherein said temperature not greater than 380° C. prevents protrusion of said metal interconnection line into said via opening;

depositing a first metal layer overlying said barrier layer and filling said via opening;

annealing said first metal layer; and etching said first metal layer to leave a metal plug within said via opening thereby completing said via formation in the fabrication of said integrated circuit device.

2. The method according to claim 1 wherein said barrier layer is titanium nitride and has a thickness of between about 25 and 200 angstroms.

3. The method according to claim 2 wherein said titanium nitride barrier layer is deposited by chemical vapor deposition (CVD).

4. The method according to claim 1 wherein said first metal layer is tungsten.

5. The method according to claim 1 wherein said annealing of said first metal layer is performed in a $N_2/H_2$ ambient wherein said wafer is warmed to between about 350° C. and 420° C.

6. The method according to claim 1 wherein said dielectric layer is a silicon oxide.

7. The method according to claim 1 wherein said dielectric layer is silicon nitride.

8. A method of via formation in the manufacturing of an integrated circuit device comprising:

providing semiconductor device structures in and on the substrate of a semiconductor wafer wherein said semiconductor device structures include gate electrodes, source and drain regions and metal interconnection lines;

depositing a dielectric layer overlying said semiconductor device structures;

etching a via opening through said dielectric layer to contact one of said metal interconnection lines;

loading said wafer into a deposition chamber and warming said wafer to a temperature of between 370° C. and 380° C. at a pressure between 2 and 3 Torr wherein said temperature not greater than 380° C. prevents protrusion of said metal interconnection line into said via opening;

thereafter conformally depositing a barrier layer within said via opening wherein the temperature of said wafer remains at or below 380° C. wherein said temperature not greater than 380° C. prevents protrusion of said metal interconnection line into said via opening;

depositing a tungsten layer overlying said barrier layer and filling said via opening;

annealing said tungsten layer; and etching said tungsten layer to leave a tungsten plug within said via opening thereby completing said via formation in the fabrication of said integrated circuit device.

9. The method according to claim 8 wherein said barrier layer is titanium nitride and has a thickness of between about 25 and 200 angstroms.

10. The method according to claim 9 wherein said titanium nitride barrier layer is deposited by chemical vapor deposition (CVD).

11. The method according to claim 8 wherein said annealing of said tungsten layer is performed in a $N_2/H_2$ ambient wherein said wafer is warmed to between about 350° C. and 420° C.

12. The method according to claim 8 wherein said dielectric layer is a silicon oxide.

13. The method according to claim 8 wherein said dielectric layer is silicon nitride.

14. A method of via formation in the manufacturing of an integrated circuit device comprising:

providing semiconductor device structures in and on the substrate of a semiconductor wafer wherein said semiconductor device structures include gate electrodes, source and drain regions and metal interconnection lines;

depositing a dielectric layer overlying said semiconductor device structures;

etching a via opening through said dielectric layer to contact one of said metal interconnection lines;

loading said wafer into a deposition chamber and warming said wafer to a temperature of between 370° C. and 380° C. at a pressure between 2 and 3 Torr wherein said temperature not greater than 380° C. prevents protrusion of said metal interconnection line into said via opening;

thereafter conformally depositing a barrier layer by chemical vapor deposition within said via opening wherein the temperature of said wafer remains at or below 380° C. wherein said temperature not greater than 380° C. prevents protrusion of said metal interconnection line into said via opening;

depositing a first metal layer overlying said barrier layer and filling said via opening;

annealing said first metal layer; and etching said first metal layer to leave a metal plug within said via opening thereby completing said via formation in the fabrication of said integrated circuit device.

15. The method according to claim 14 wherein said barrier layer has a thickness of between about 25 and 200 angstroms.

16. The method according to claim 14 wherein said first metal layer is tungsten.

17. The method according to claim 14 wherein said annealing of said first metal layer is performed in a $N_2/H_2$ ambient wherein said wafer is warmed to between about 350° C. and 420° C.

18. The method according to claim 14 wherein said second metal layer is aluminum or an aluminum alloy.

19. The method according to claim 14 wherein said dielectric layer is a silicon oxide.

20. The method according to claim 14 wherein said dielectric layer is silicon nitride.

* * * * *